United States Patent
Konoma

(10) Patent No.: US 10,958,238 B2
(45) Date of Patent: Mar. 23, 2021

(54) ELASTIC WAVE DEVICE

(71) Applicant: Murata Manufacturing Co., Ltd., Nagaokakyo (JP)

(72) Inventor: Chihiro Konoma, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 600 days.

(21) Appl. No.: 15/832,880

(22) Filed: Dec. 6, 2017

(65) Prior Publication Data

US 2018/0109236 A1 Apr. 19, 2018

Related U.S. Application Data

(63) Continuation of application No. PCT/JP2016/066247, filed on Jun. 1, 2016.

(30) Foreign Application Priority Data

Jul. 2, 2015 (JP) .............................. JP2015-133439

(51) Int. Cl.
*H03H 9/02* (2006.01)
*H01L 41/047* (2006.01)
(Continued)

(52) U.S. Cl.
CPC ..... *H03H 9/02984* (2013.01); *H01L 41/0477* (2013.01); *H03H 9/02559* (2013.01);
(Continued)

(58) Field of Classification Search
CPC ............ H03H 9/02984; H03H 9/14541; H01L 41/047; H01L 41/0477
(Continued)

(56) References Cited

U.S. PATENT DOCUMENTS

2005/0122000 A1* 6/2005 Hakamada ......... H03H 9/14541
310/313 R
2006/0175639 A1 8/2006 Leidl et al.
(Continued)

FOREIGN PATENT DOCUMENTS

CN 101268611 A 9/2008
CN 102111121 A 6/2011
(Continued)

OTHER PUBLICATIONS

Official Communication issued in corresponding Korean Patent Application No. 10-2017-7033191, dated Dec. 18, 2018.
(Continued)

*Primary Examiner* — Derek J Rosenau
(74) *Attorney, Agent, or Firm* — Keating & Bennett, LLP

(57) ABSTRACT

An elastic wave device includes a piezoelectric substrate and an interdigital transducer electrode provided on the piezoelectric substrate. The interdigital transducer electrode includes at least one electrode layer including an outermost electrode layer, and a protective electrode layer protecting the outermost electrode layer, the protective electrode layer has a higher electric resistivity than the outermost electrode layer, the outermost electrode layer includes a first principal surface located at a side opposite to the piezoelectric substrate side, and a side surface connected to the first principal surface, the first principal surface of the outermost electrode layer and a region extending from the first principal surface to at least a portion of the side surface are covered with the protective electrode layer, and the protective electrode layer does not extend beyond a lower edge of the side surface of the outermost electrode layer.

14 Claims, 2 Drawing Sheets

(51) Int. Cl.
*H03H 9/145* (2006.01)
*H03H 9/25* (2006.01)
*H03H 9/64* (2006.01)

(52) U.S. Cl.
CPC .......... *H03H 9/14541* (2013.01); *H03H 9/25* (2013.01); *H03H 9/6483* (2013.01)

(58) Field of Classification Search
USPC ...... 310/313 R, 313 A, 313 B, 313 C, 313 D
See application file for complete search history.

(56) References Cited

U.S. PATENT DOCUMENTS

| | | | |
|---|---|---|---|
| 2009/0121584 A1 | 5/2009 | Nishimura et al. | |
| 2011/0156531 A1 | 6/2011 | Tamazaki et al. | |
| 2012/0019101 A1* | 1/2012 | Nakahashi | H03H 9/02984 |
| | | | 310/313 C |
| 2013/0300519 A1 | 11/2013 | Tamasaki et al. | |
| 2014/0232239 A1* | 8/2014 | Iwasaki | H03H 9/02834 |
| | | | 310/313 C |

FOREIGN PATENT DOCUMENTS

| | | |
|---|---|---|
| JP | 04-294625 A | 10/1992 |
| JP | 05-22067 A | 1/1993 |
| JP | 10-145171 A | 5/1998 |
| JP | 2001-217672 A | 8/2001 |
| JP | 2005-518127 A | 6/2005 |
| JP | 2006-101082 A | 4/2006 |
| JP | 2012-186696 A | 9/2012 |
| JP | 5131117 B2 | 1/2013 |
| JP | 2015-111845 A | 6/2015 |

OTHER PUBLICATIONS

Official Communication issued in International Patent Application No. PCT/JP2016/066247, dated Aug. 16, 2016.

* cited by examiner

ELASTIC WAVE DEVICE

CROSS REFERENCE TO RELATED APPLICATIONS

This application claims the benefit of priority to Japanese Patent Application No. 2015-133439 filed on Jul. 2, 2015 and is a Continuation Application of PCT Application No. PCT/JP2016/066247 filed on Jun. 1, 2016. The entire contents of each application are hereby incorporated herein by reference.

BACKGROUND OF THE INVENTION

1. Field of the Invention

The present invention relates to an elastic wave device preferably used as a resonator, a band bass filter, or other suitable device, for example.

2. Description of the Related Art

An elastic wave device has been widely used as a resonator or a band bass filter.

Japanese Patent No. 5131117 and Japanese Unexamined Patent Application Publication No. 2001-217672 each disclose an elastic wave device in which an interdigital transducer electrode is provided on a piezoelectric substrate. Japanese Patent No. 5131117 discloses a multilayer metal film in which NiCr, Pt, Ti, AlCu, and Ti are laminated in this order, as the interdigital transducer electrode. Japanese Unexamined Patent Application Publication No. 2001-217672 discloses a multilayer metal film in which Al is laminated on Ti, as the interdigital transducer electrode. In Japanese Unexamined Patent Application Publication No. 2001-217672, the multilayer metal film is coated with a coating electrode film.

The interdigital transducer electrode of the elastic wave device may be exposed to a plasma atmosphere when forming a dielectric film or when removing organic residue on the surface thereof.

Here, when the interdigital transducer electrode having a multilayer structure as disclosed in Japanese Patent No. 5131117 is exposed to a plasma atmosphere, an electrode film such as an Al film or a Cu film present as the outermost layer of the interdigital transducer electrode is often damaged. As a result, the electrical characteristics may deteriorate.

Further, when the multilayer metal film is fully coated with the coating metal film as disclosed in Japanese Unexamined Patent Application Publication No. 2001-217672, the characteristics of the electrode may deteriorate.

SUMMARY OF THE INVENTION

Preferred embodiments of the present invention provide elastic wave devices in which deterioration of characteristics is unlikely to occur even when an interdigital transducer electrode is exposed to a plasma atmosphere.

An elastic wave device according to a preferred embodiment of the present invention includes a piezoelectric substrate; and an interdigital transducer electrode provided on the piezoelectric substrate, wherein the interdigital transducer electrode includes at least one electrode layer including an outermost electrode layer, and a protective electrode layer protecting the outermost electrode layer, the protective electrode layer has a higher electric resistivity than the outermost electrode layer, the outermost electrode layer includes a first principal surface located at a side opposite to the piezoelectric substrate side, and a side surface connected to the first principal surface, the first principal surface of the outermost electrode layer and a region extending from the first principal surface to at least a portion of the side surface are covered with the protective electrode layer, and the protective electrode layer does not extend beyond a lower edge of the side surface of the outermost electrode layer.

In an elastic wave device according to a preferred embodiment of the present invention, a ridgeline defined by the first principal surface and the side surface of the outermost electrode layer is covered with the protective electrode layer. In this case, it is possible to effectively protect the outermost electrode layer, so that deterioration of the characteristics is more unlikely to occur.

In an elastic wave device according to a preferred embodiment of the present invention, the side surface of the outermost electrode layer is covered with the protective electrode layer. In this case, it is possible to more reliably protect the outermost electrode layer.

In an elastic wave device according to a preferred embodiment of the present invention, the outermost electrode layer includes a second principal surface opposing the first principal surface, and the second principal surface of the outermost electrode layer is covered with the protective electrode layer. In this case, it is possible to even more reliably protect the outermost electrode layer.

In an elastic wave device according to a preferred embodiment of the present invention, the outermost electrode layer is made of at least one of Al and Cu. In this case, it is possible to decrease the resistance of an electrode, and thus, it is possible to reduce loss.

In an elastic wave device according to a preferred embodiment of the present invention, the protective electrode layer is made of at least one of Ti and Mo. In this case, it is possible to more reliably protect the outermost electrode layer.

In an elastic wave device according to a preferred embodiment of the present invention, the interdigital transducer electrode includes a plurality of electrode layers including the outermost electrode layer, and the protective electrode layer protecting the outermost electrode layer.

In an elastic wave device according to a preferred embodiment of the present invention, the plurality of electrode layers include a second electrode layer below the outermost electrode layer, and the second electrode layer is made of a metal having a higher density than a metal of the outermost electrode layer.

In an elastic wave device according to a preferred embodiment of the present invention, the second electrode layer is made of at least one of Pt and Au.

In an elastic wave device according to a preferred embodiment of the present invention, the side surface includes a pair of side surface portions opposing each other, and each side surface portion is inclined such that a distance between the pair of side surface portions opposing each other decreases from the second principal surface towards the first principal surface.

In an elastic wave device according to a preferred embodiment of the present invention, the interdigital transducer electrode is a multilayer metal film in which a NiCr layer, the second electrode layer, a Ti layer, the outermost electrode layer, and the protective electrode layer are laminated in this order.

According to various preferred embodiments of the present invention, it is possible to provide elastic wave devices in which deterioration of characteristics is unlikely to occur even when an interdigital transducer electrode is exposed to a plasma atmosphere.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the drawings to clarify the present invention.

It should be noted that each preferred embodiment described in the present specification is illustrative, and the components in the different preferred embodiments may be partially replaced or combined.

First Preferred Embodiment

Figure 1A:
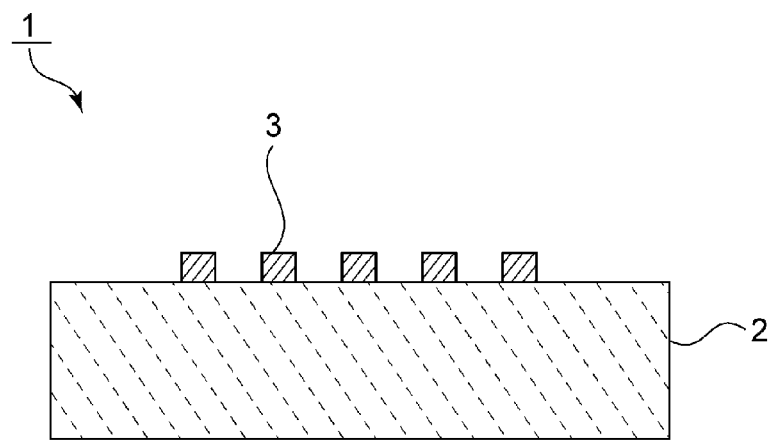
FIG. 1A is a schematic elevational cross-sectional view of an elastic wave device according to a first preferred embodiment of the present invention.
Figure 1B:
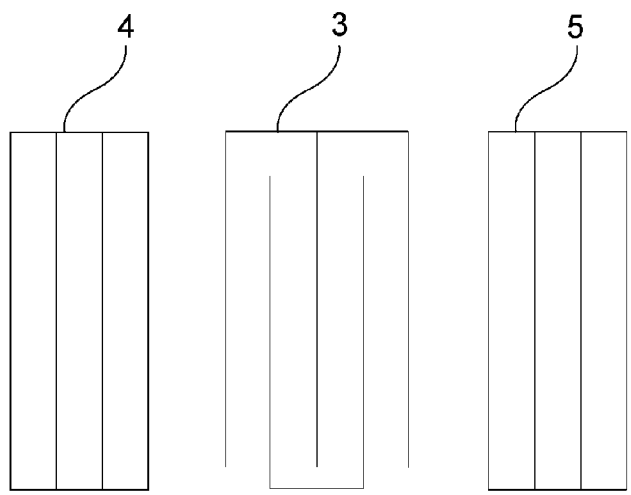
FIG. 1B is a schematic plan view showing an electrode structure of the elastic wave device.
Figure 2:
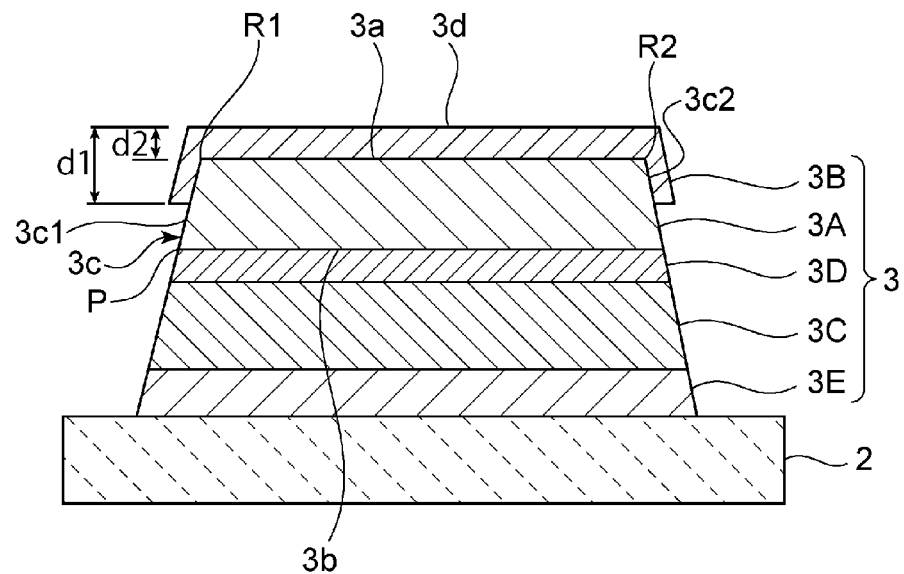
FIG. 2 is an enlarged schematic elevational cross-sectional view of an interdigital transducer electrode portion of the elastic wave device according to the first preferred embodiment of the present invention.

FIG. 1A is a schematic elevational cross-sectional view of an elastic wave device according to a first preferred embodiment of the present invention, and FIG. 1B is a schematic plan view of an electrode structure of the elastic wave device. FIG. 2 is an enlarged schematic elevational cross-sectional view of an interdigital transducer electrode portion of the elastic wave device according to the first preferred embodiment of the present invention.

The elastic wave device 1 includes a piezoelectric substrate 2. An interdigital transducer electrode 3 is provided on a principal surface of the piezoelectric substrate 2.

The piezoelectric substrate 2 is a substrate preferably made of $LiNbO_3$, for example. However, as the piezoelectric substrate 2, a substrate made of another piezoelectric monocrystal, such as $LiTaO_3$ may be used, or a substrate made of piezoelectric ceramics may be used.

Although schematically shown in FIG. 1A, the electrode structure shown in FIG. 1B is preferably provided on the piezoelectric substrate 2. That is, the interdigital transducer electrode 3 and reflectors 4 and 5 disposed at both sides of the interdigital transducer electrode 3 in an elastic wave propagation direction in which an elastic wave propagates are preferably provided. Accordingly, a one-port type elastic wave resonator is provided, for example. However, the electrode structure including the interdigital transducer electrode in various preferred embodiments of the present invention is not particularly limited. A filter may be provided by combining a plurality of resonators, for example. Examples of such a filter include a ladder filter, a longitudinally-coupled resonator filter, and a lattice filter.

The interdigital transducer electrode 3 includes first and second busbars and pluralities of first and second electrode fingers. The pluralities of first and second electrode fingers extend in a direction orthogonal or substantially orthogonal to the elastic wave propagation direction. The plurality of first electrode fingers and the plurality of second electrode fingers are interdigitated with each other. In addition, the plurality of first electrode fingers are connected to the first busbar, and the plurality of second electrode fingers are connected to the second busbar.

As shown in an enlarged manner in FIG. 2, the interdigital transducer electrode 3 is preferably a multilayer metal film in which an NiCr layer 3E, a third electrode layer 3C, a Ti layer 3D, a first electrode layer 3A, and a second electrode layer 3B are laminated in this order.

The second electrode layer 3B is a protective electrode layer. The first electrode layer 3A is an outermost electrode layer in the protective electrode layer excluding the second electrode layer 3B, which is the protective electrode layer, and the Ti layer 3D. In addition, the third electrode layer 3C is the second electrode layer in the multilayer metal film excluding the second electrode layer 3B, which is the protective electrode layer, and the Ti layer 3D. The third electrode layer 3C is disposed below the first electrode layer 3A.

The first electrode layer 3A includes first and second principal surfaces 3a and 3b opposing each other. In addition, the first electrode layer 3A includes a side surface 3c connecting the first and second principal surfaces 3a and 3b to each other. The side surface 3c includes first and second side surface portions 3c1 and 3c2 opposing each other.

The first and second side surface portions 3c1 and 3c2 are inclined such that the distance between the first and second side surface portions 3c1 and 3c2 decreases from the second principal surface 3b toward the first principal surface 3a. As shown in FIG. 2, the NiCr layer 3E, the third electrode layer 3C, and the Ti layer 3D also preferably have the same or substantially the same shape as the first electrode layer 3A.

The first electrode layer 3A is preferably made of Al, for example. The first electrode layer 3A may be made of another metal such as Cu, or an alloy thereof, for example. Among these materials, the first electrode layer 3A is preferably made of a metal having a low electric resistivity. In this case, it is possible to further decrease the electric resistivity of the interdigital transducer electrode 3, and thus, it is possible to further decrease loss. Examples of the metal having a low electric resistivity include Al, Cu, and alloys thereof.

The second electrode layer 3B is laminated on the first principal surface 3a of the first electrode layer 3A. The second electrode layer 3B covers the first principal surface 3a of the first electrode layer 3A and a region extending from the first principal surface 3a to a portion of the side surface 3c. In particular, in the elastic wave device 1, ridgelines R1 and R2 shown in FIG. 2 are also covered with the second electrode layer 3B. The ridgeline R1 is a ridgeline defined by the first principal surface 3a and the first side surface portion 3c1. The ridgeline R2 is a ridgeline defined by the first principal surface 3a and the second side surface portion 3c2.

The second electrode layer 3B includes a third principal surface 3d. The third principal surface 3d is the principal surface of the second electrode layer 3B that is opposite to the principal surface of the second electrode layer 3B that is in contact with the first principal surface 3a. Here, the distance between the third principal surface 3d and a portion of the second electrode layer 3B that is closest to the piezoelectric substrate 2 is denoted by d1. In addition, the distance between the third principal surface 3d and the first principal surface 3a is denoted by d2. In the present invention, the ratio d1/d2 of d1 to d2 is preferably not less than about 1.0 and not greater than about 7.0, for example. When the ratio d1/d2 falls within the above range, it is possible to more effectively reduce or prevent damage of the first electrode layer 3A due to plasma. Furthermore, the interdigital transducer electrode 3 is not exceedingly heavy as described later, and thus, deterioration of the characteristics is less likely to occur. Regarding d1 and d2, for example, when d2 is about 10 nm, d1 may preferably be about 10 nm to about 70 nm.

The second electrode layer 3B is preferably made of Ti, for example. The second electrode layer 3B may be formed from another metal such as Mo or an alloy thereof, for example. Among these materials, the second electrode layer 3B is preferably made of a metal having a higher electric resistivity than the first electrode layer 3A. Examples of the metal having a higher electric resistivity than the first electrode layer 3A include Ti, Mo, and alloys thereof.

The third electrode layer 3C is preferably disposed between the second principal surface 3b of the first electrode layer 3A and the piezoelectric substrate 2. The third electrode layer 3C is preferably made of Pt, for example. However, the third electrode layer 3C may be made of another metal such as Au or an alloy thereof, for example. In addition, the third electrode layer 3C is preferably made of a metal having a higher density than the first electrode layer 3A. Examples of the metal having a higher density than the first electrode layer 3A include noble metals such as Pt and Au, and alloys thereof. The third electrode layer 3C may not be provided.

When the third electrode layer 3C including, as a principal component, a metal having a higher density than the first electrode layer 3A is provided below the first electrode layer 3A as in the elastic wave device 1, since the density of the third electrode layer 3C is high, it is possible to increase the reflection coefficient for an elastic wave, and it is possible to improve the electric characteristics of the elastic wave device. In the present specification, a principal component refers to a component included in an amount of about 50 wt % or more.

Meanwhile, when producing an elastic wave device, a SiO$_2$ film is formed as a temperature-adjusting film by a sputtering method, for example, or organic residue on a surface is removed in some cases. In such a case, an interdigital transducer electrode defining a portion of the elastic wave device may be exposed to a plasma atmosphere. Thus, in an existing elastic wave device, an electrode layer located at an upper portion of the interdigital transducer electrode may be damaged by plasma, resulting in deterioration of the characteristics.

On the other hand, in the elastic wave device 1 of the present preferred embodiment, the first principal surface 3a of the first electrode layer 3A and the region extending from the first principal surface 3a to the portion of the side surface 3c are covered with the second electrode layer 3B. Thus, in the elastic wave device 1, the first electrode layer 3A, which is located at an upper portion, is unlikely to be damaged even when the elastic wave device 1 is exposed to a plasma atmosphere. Thus, in the elastic wave device 1, deterioration of the characteristics is unlikely to occur even when the elastic wave device 1 is exposed under a plasma atmosphere.

The second electrode layer 3B preferably does not extend beyond a lower edge P of the side surface 3c of the first electrode layer 3A. That is, the second electrode layer 3B is not provided so as to cover the NiCr layer 3E, the third electrode layer 3C, and the Ti layer 3D. Thus, even when the second electrode layer 3B is provided, the interdigital transducer electrode 3 is not exceedingly heavy, and the state of an energy distribution or a frequency is unlikely to change. Thus, also from this viewpoint, the elastic wave device 1 is unlikely to cause deterioration of the characteristics.

In the present preferred embodiment, the ridgelines R1 and R2 which are likely to be damaged by plasma are covered with the second electrode layer 3B. Thus, in the elastic wave device 1, deterioration of the characteristics upon exposure under a plasma atmosphere is further unlikely to occur. In the present invention, the ridgelines R1 and R2 are preferably covered with the second electrode layer 3B.

The third electrode layer 3C may be omitted, if desired. The interdigital transducer electrode 3 may be, for example, a multilayer metal film in which the Ti layer 3D, the first electrode layer 3A, and the second electrode layer 3B are laminated in this order. In this case, for example, Al, Cu, AlCu, or other suitable materials may preferably be used as the first electrode layer 3A. Ti, Mo, or other suitable materials, for example, may preferably be used as the second electrode layer 3B.

In addition, the interdigital transducer electrode 3 may be a multilayer metal film including the first electrode layer 3A and the second electrode layer 3B laminated on the first electrode layer 3A. In this case, Al, Cu, AlCu, or other suitable materials, for example, may preferably be used as the first electrode layer 3A. Ti, Mo, or other suitable materials, for example, may preferably be used as the second electrode layer 3B.

As described above, as long as the interdigital transducer electrode 3 includes the first and second electrode layers 3A and 3B, the interdigital transducer electrode 3 is able to adopt various multilayer structures.

A production method for the elastic wave device 1 is not particularly limited, but it is possible to produce the elastic wave device 1, for example, by the following method.

First, a LiNbO$_3$ substrate is prepared as the piezoelectric substrate 2. Next, a pattern of resist is formed on the piezoelectric substrate 2 by a photolithographic method. Subsequently, a multilayer metal film in which NiCr, Pt, Ti, Al, and Ti are laminated in this order is formed by a vacuum deposition method. Thereafter, an unnecessary portion of the multilayer metal film is removed together with the resist by a lift-off method. Accordingly, the interdigital transducer electrode 3 and a wiring electrode that is not shown are formed on the piezoelectric substrate 2. In this production method, the multilayer metal film forming the interdigital transducer electrode 3 is preferably produced as Ti/Al/Ti/Pt/NiCr=about 10 nm/about 150 nm/about 10 nm/about 80 nm/about 10 nm, for example.

In forming the multilayer metal film by vacuum deposition, when a Ti layer (second electrode layer 3B) is formed as an uppermost layer, the degree of vacuum is decreased by introducing gas into a chamber. Accordingly, the vertical incidence of deposition particles is deteriorated, and the deposition particles are caused to extend to the side surface 3c of the Al layer (first electrode layer 3A) to be adhered thereto. As a result, it is possible to form the second electrode layer 3B such that the second electrode layer 3B covers the first principal surface 3a of the first electrode layer 3A and the region extending from the first principal surface 3a to the portion of the side surface 3c. For example, Ar gas may preferably be used as the gas to be introduced into the chamber.

Next, ashing of applying oxygen plasma is performed on the piezoelectric substrate 2 and the interdigital transducer electrode 3. Accordingly, the resist and residue of a resist peeling solution remaining on the piezoelectric substrate 2 and the interdigital transducer electrode 3 are removed.

For the purpose of protecting the interdigital transducer electrode 3 from foreign matter and other contaminants, a protective film preferably made of a $SiO_2$ film, for example, may be provided on the piezoelectric substrate 2 and the interdigital transducer electrode 3 by using an RF sputtering method.

As described above, in this production method, in ashing or sputtering, the interdigital transducer electrode 3 may be exposed to a plasma atmosphere. However, in the elastic wave device 1, the first principal surface 3a of the first electrode layer 3A and the region extending from the first principal surface 3a to the portion of the side surface 3c are covered with the second electrode layer 3B as described above. Thus, in the elastic wave device 1, deterioration of the characteristics is unlikely to occur even when the elastic wave device 1 is exposed to a plasma atmosphere.

In this production method, as described above, the interdigital transducer electrode 3 is produced with the same deposition facility, and thus it is possible to simplify the production process.

Second Preferred Embodiment

Figure 3:
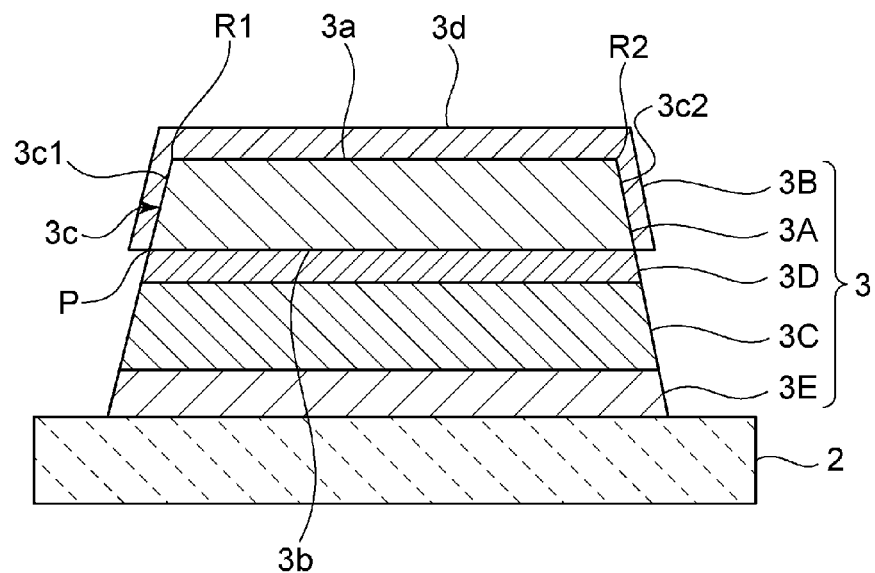
FIG. 3 is an enlarged schematic elevational cross-sectional view of an interdigital transducer electrode portion of an elastic wave device according to a second preferred embodiment of the present invention.

FIG. 3 is an enlarged schematic cross-sectional view of an interdigital transducer electrode portion of an elastic wave device according to a second preferred embodiment of the present invention. As shown in FIG. 3, in the elastic wave device according to the second preferred embodiment, on the first electrode layer 3A, the first principal surface 3a and a region extending from the first principal surface 3a to the second principal surface 3b are preferably covered with the second electrode layer 3B. That is, in the elastic wave device according to the second preferred embodiment, the entirety of the side surface 3c of the first electrode layer 3A preferably is covered with the second electrode layer 3B. The remaining structure and features are the same or substantially the same as in the first preferred embodiment.

In the elastic wave device according to the second preferred embodiment, the first principal surface 3a and the side surface 3c of the first electrode layer 3A are covered with the second electrode layer 3B. Thus, the first electrode layer 3A, which is located at the upper portion of the interdigital transducer electrode 3, is unlikely to be damaged even when being exposed under a plasma atmosphere. Therefore, in the elastic wave device according to the second preferred embodiment, deterioration of the characteristics is unlikely to occur when the elastic wave device is exposed to a plasma atmosphere.

The second electrode layer 3B preferably does not extend beyond the lower edge P of the side surface 3c of the first electrode layer 3A. That is, the second electrode layer 3B does not cover the NiCr layer 3E, the third electrode layer 3C, and the Ti layer 3D. Thus, even when the second electrode layer 3B is provided, the interdigital transducer electrode 3 is not exceedingly heavy, and the state of an energy distribution or a frequency is unlikely to change. Thus, also from this viewpoint, the elastic wave device according to the second preferred embodiment is unlikely to cause deterioration of the characteristics.

In addition, in the second preferred embodiment, the ridgelines R1 and R2, which are easily damaged by plasma, are covered with the second electrode layer 3B. Thus, deterioration of the characteristics is even less likely to occur in the case of being exposed to a plasma atmosphere.

In the second preferred embodiment, since the first principal surface 3a and the entirety of the side surface 3c of the first electrode layer 3A are covered with the second electrode layer 3B, it is possible to reduce or prevent corrosion of the first electrode layer 3A.

In the second preferred embodiment, the second principal surface 3b of the first electrode layer 3A is preferably covered with a Ti layer that is the same or substantially the same as the second electrode layer 3B. That is, in the second preferred embodiment, the first electrode layer 3A is fully covered with the Ti layer. In the case where the first electrode layer 3A is fully covered with the Ti layer as described above, it is possible to more reliably reduce or prevent corrosion of the first electrode layer 3A.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric substrate; and
an interdigital transducer electrode provided on the piezoelectric substrate; wherein
the interdigital transducer electrode includes a plurality of electrode layers including an outermost electrode layer, a first electrode layer below the outermost electrode layer, and a protective electrode layer protecting the outermost electrode layer;
the protective electrode layer has a higher electric resistivity than the outermost electrode layer;
the outermost electrode layer includes a first principal surface located at a side opposite to a side of the piezoelectric substrate, and a side surface connected to the first principal surface;
the first principal surface of the outermost electrode layer and a region extending from the first principal surface to at least a portion of the side surface are covered with the protective electrode layer; and
the protective electrode layer does not extend beyond a lower edge of the side surface of the outermost electrode layer.

2. The elastic wave device according to claim 1, wherein a ridgeline defined by the first principal surface and the side surface of the outermost electrode layer is covered with the protective electrode layer.

3. The elastic wave device according to claim 1, wherein the side surface of the outermost electrode layer is covered with the protective electrode layer.

4. The elastic wave device according to claim 1, wherein
the outermost electrode layer includes a second principal surface opposing the first principal surface;
the plurality of electrode layers further include a second electrode layer below the first electrode layer;
the first electrode layer is directly laminated on the second principal surface;
a material of the first electrode layer is the same as the protective electrode layer; and
the second principal surface of the outermost electrode layer is covered with the first electrode layer.

5. The elastic wave device according to claim 1, wherein the outermost electrode layer is made of at least one of Al and Cu.

6. The elastic wave device according to claim 1, wherein the protective electrode layer is made of at least one of Ti and Mo.

7. The elastic wave device according to claim 1, wherein the plurality of electrode layers include a second electrode layer below the outermost electrode layer; and
the second electrode layer is made of a metal having a higher density than a metal of the outermost electrode layer.

8. The elastic wave device according to claim 7, wherein the second electrode layer is made of at least one of Pt and Au.

9. The elastic wave device according to claim 1, wherein
the outermost electrode layer includes a second principal surface opposing the first principal surface;
the side surface includes a pair of side surface portions opposing each other; and
each of the pair of side surface portions is inclined such that a distance between the pair of side surface portions opposing each other decreases from the second principal surface towards the first principal surface.

10. The elastic wave device according to claim 7, wherein the plurality of electrode layers is a multilayer metal film in which a NiCr layer, the second electrode layer, the first electrode layer, the outermost electrode layer, and the protective electrode layer are laminated in this order.

11. The elastic wave device according to claim 1, wherein the piezoelectric substrate is made of $LiNbO_3$.

12. The elastic wave device according to claim 1, wherein the piezoelectric substrate is made of $LiTaO_3$.

13. The elastic wave device according to claim 1, wherein the interdigital transducer electrode includes:
first and second busbars; and
pluralities of first and second electrode fingers;
the pluralities of first and second electrode fingers extend in a direction orthogonal or substantially orthogonal to an elastic wave propagation direction;
the plurality of first electrode fingers and the plurality of second electrode fingers are interdigitated with each other; and
the plurality of first electrode fingers are connected to the first busbar, and the plurality of second electrode fingers are connected to the second busbar.

14. The elastic wave device according to claim 1, wherein an entirety of the side surface of the outermost electrode layer is covered with the protective electrode layer.

\* \* \* \* \*